United States Patent
Nakashiba (10) Patent No.: US 8,004,062 B2
(45) Date of Patent: Aug. 23, 2011

(54) SEMICONDUCTOR DEVICE (75) Inventor: Yasutaka Nakashiba, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 268 days.

(21) Appl. No.: 12/453,736

(22) Filed: May 20, 2009

(65) Prior Publication Data
US 2009/0302420 A1     Dec. 10, 2009

(30) Foreign Application Priority Data

Jun. 5, 2008     (JP) ................. 2008-148164

(51) Int. Cl.
*H01L 27/08*     (2006.01)

(52) U.S. Cl. ........ 257/531; 257/532; 257/687; 257/692; 257/700; 257/723

(58) Field of Classification Search ........................ None
See application file for complete search history.

(56) References Cited

U.S. PATENT DOCUMENTS

| 5,952,849 A | 9/1999 | Haigh | |
|---|---|---|---|
| 2009/0066457 A1* | 3/2009 | Uchida | 336/188 |

FOREIGN PATENT DOCUMENTS

| JP | 10-163422 | 6/1998 |
|---|---|---|
| JP | 2001-513276 | 8/2001 |

* cited by examiner

*Primary Examiner* — N Drew Richards
*Assistant Examiner* — Kyoung Lee
(74) *Attorney, Agent, or Firm* — McGinn IP Law Group, PLLC (57) ABSTRACT

A multilayer wiring layer 400, a first inductor 310 and a second inductor 320 are formed on a substrate 10. The multilayer wiring layer is formed by alternately stacking an insulating layer and a wiring layer in this order t or more times (t≧3). The first inductor 310 is provided in the nth wiring layer in the multilayer wiring layer 400. The second inductor 320 is provided in the mth wiring layer in the multilayer wiring layer 400 (t≧m≧n+2) and positioned above the first inductor 310. No inductor is provided in any of the wiring layers positioned between the nth wiring layer and the mth wiring layer to be positioned above the first inductor 310. The first inductor 310 and the second inductor 320 constitute a signal transmitting device 300 which transmits an electrical signal in either of two directions.

8 Claims, 9 Drawing Sheets

SEMICONDUCTOR DEVICE

BACKGROUND OF THE INVENTION

1. Field of the Invention

The present invention relates to a semiconductor device capable of transmitting an electrical signal between two circuits having input electrical signals differing in potential from each other.

2. Description of the Related Art

In a case where an electrical signal is transmitted between two circuits having input electrical signals differing in potential from each other, a photocoupler is ordinarily used. The photocoupler has a light emitting element such as a light emitting diode and a light receiving element such as a phototransistor. An electrical signal input to the photocoupler is converted into light by the light emitting element and the electrical signal is restored from this light by the light receiving element, thus transmitting the electrical signal.

Since the photocoupler has the light emitting element and the light receiving element, it is difficult to reduce the size of the photocoupler. Also, the photocoupler is incapable of following an electrical signal if the frequency of the electrical signal is high. As a technique to solve these problems, a technique of transmitting an electrical signal by using inductive coupling between two inductors, for example, as described in National Publication of International Patent Application No. 2001-513276 has been developed.

Japanese Patent Laid-Open No. 10-163422 discloses a technique of forming an inductance by using a plurality of wiring layers stacked on a semiconductor substrate with interlayer insulating films interposed therebetween. In this technique, first circular-arc wiring patterns forming a winding on the input side and second-circular arc wiring patterns forming a winding on the output side are alternately stacked. In each wiring layer, one of the circular-arc wiring patterns is formed.

The present inventor has recognized as follows. With respect to reducing the size of a device which transmits an electrical signal between two circuits having input electrical signals differing in potential from each other, application of a semiconductor device manufacturing technique to forming inductors in two wiring layers so that the inductors face each other through an interlayer insulating film is conceivable. In such a case, the insulation withstand voltage between the two inductors is insufficient with respect to the potential difference between the two inductors due to the interlayer insulating film having a small thickness. There is, therefore, a demand for a technique to improve the insulating withstand voltage between the two inductors.

SUMMARY

The present invention provides a semiconductor device including a substrate, a multilayer wiring layer formed on the substrate and having an insulating layer and a wiring layer alternately stacked in this order t or more times ($t \geq 3$), a first inductor provided in the nth wiring layer in the multilayer wiring layer, and a second inductor provided in the mth wiring layer in the multilayer wiring layer ($t \geq m \geq n+2$) and positioned above the first inductor, wherein no inductor is provided in any of the wiring layers positioned between the nth wiring layer and the mth wiring layer to be positioned above the first inductor.

In this semiconductor device, the at least two insulating layers are positioned between the first inductor and the second inductor, and no inductor is provided in any of these insulating layers to be positioned above the first inductor. As a result, the insulation withstand voltage between the first inductor and the second inductor is increased.

According to the present invention, the insulation withstand voltage between the first inductor and the second inductor can be increased.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Embodiments of the present invention will be described with reference to the accompanying drawings. Similar components are indicated by the same reference numerals and redundancy of descriptions of them is avoided.

Figure 1:
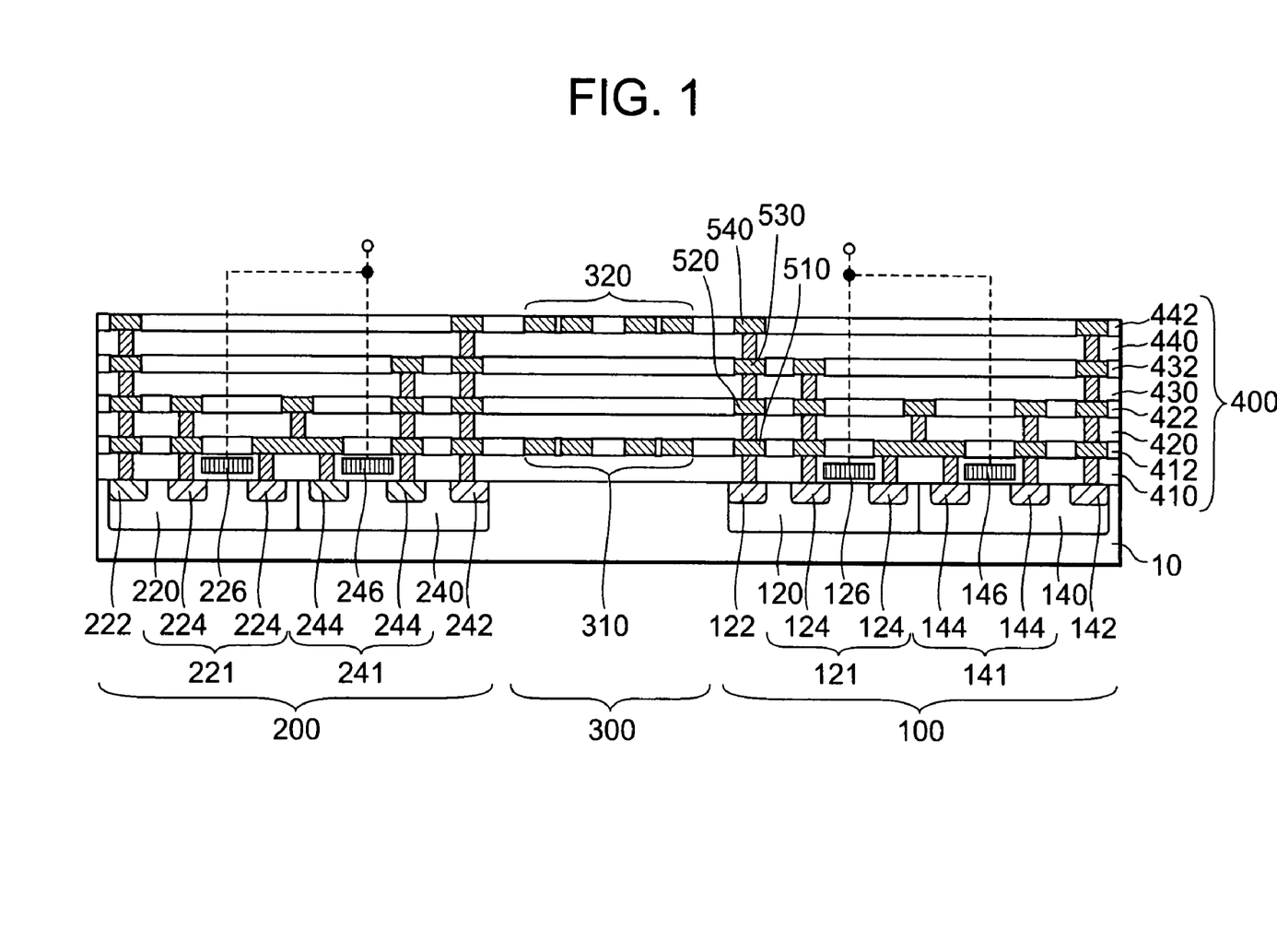
FIG. 1 is a sectional view of a semiconductor device according to a first embodiment of the present invention.

FIG. 1 is a sectional view of a semiconductor device in the first embodiment. This semiconductor device has a substrate 10, a multilayer wiring layer 400, a first inductor 310 and a second inductor 320. The multilayer wiring layer 400, the first inductor 310 and the second inductor 320 are formed on the substrate 10. The multilayer wiring layer 400 is formed by alternately stacking an insulating layer and a wiring layer in this order t or more times ($t \geq 3$). The first inductor 310 is provided in the nth wiring layer in the multilayer wiring layer 400. The second inductor 320 is provided in the mth wiring layer in the multilayer wiring layer 400 ($t \geq m \geq n+2$) and positioned above the first inductor 310. No inductor is provided in any of the wiring layers positioned between the nth wiring layer and the mth wiring layer to be positioned above the first inductor 310. The first inductor 310 and the second inductor 320 constitute a signal transmitting device 300 which transmits an electrical signal in either of two directions. The electrical signal is, for example, a digital signal. The electrical signal may alternatively be an analog signal.

In the present embodiment, each of the first inductor 310 and the second inductor 320 is a spiral wiring pattern formed in one wiring layer. Each insulating layer may have a structure in which a plurality of interlayer insulating films are stacked or may be one interlayer insulating film. In the present embodiment, each insulating layer has a structure in which two interlayer insulating films are stacked.

In the present embodiment, the semiconductor device has a structure in which wirings 510, 520, 530, and 540 in four layers are stacked in this order. The wirings 510, 520, 530, and 540 are Cu wirings formed by a damascene method and respectively embedded in channels formed in the wiring layers 412, 422, 432, and 442. Pads (not shown) are formed in the wiring 540 in the uppermost layer. At least one of the wirings 510, 520, 530, and 540 may be Al alloy wiring.

An interlayer insulating film 410 for forming contact plugs is provided between the substrate 10 and the wiring 510 in the lowermost layer. Insulating layers 420, 430, and 440 for forming vias are respectively formed between the wirings 510 and 520, between the wirings 520 and 530 and between the wirings 530 and 540. On the substrate 10, the insulating layer 410, the wiring layer 412, the insulating layer 420, the wiring layer 422, the insulating layer 430, the wiring layer 432, the insulating layer 440 and the wiring layer 442 are stacked in this order.

Each of the insulating films constituting the insulating layers and the wiring layers may be an $SiO_2$ film or a low-dielectric-constant film. The low-dielectric-constant film may be an insulating film having a dielectric constant of, for example, 3.3 or less, preferably 2.9 or less. As the material of the low-dielectric-constant film, polyhydrogen siloxane, such as hydrogen silsesquioxane (HSQ), methyl silsesquioxane (MSQ) or methylated hydrogen silsesquioxane (MHSQ), an organic material containing an aromatic compound, such as polyallyl ether (PAE), divinyl-siloxane-bis-benzocyclobutene (BCB) or Silk (trademark), SOG, FOX (flowable oxide) (trademark), Cytop (trademark), benzocyclobutene (BCB) or the like may be used as well as SiOC. Also, as the low-dielectric-constant film, a porous film of any of these materials may be used.

The first inductor 310 is positioned in the lowermost wiring layer 412, while the second inductor 320 is positioned in the uppermost wiring layer 442. The two wiring layers 422 and 432 and the three insulating layers 420, 430, and 440 are positioned between the first inductor 310 and the second inductor 320.

The substrate 10 is a first conduction type (e.g., p-type) of semiconductor substrate. The semiconductor device further has a first circuit 100 and a second circuit 200. The first circuit 100 is connected to one of the first inductor 310 and the second inductor 320 constituting the signal transmitting device 300. The second circuit 200 is connected to the other of the first inductor 310 and the second inductor 320. These connections are made by means of the multilayer wiring layer 400 on the substrate 10. The signal transmitting device 300 is positioned, for example, between the first circuit 100 and the second circuit 200. However, the arrangement is not limited to this. For example, the signal transmitting device 300 may be included in the first circuit 100 or in the second circuit 200. The first circuit 100 and the second circuit 200 have input electrical signals differing in potential from each other. With respect to the arrangement shown in FIG. 1, "input electrical signals differ in potential from each other" means that the amplitude (the difference between a potential representing 0 and a potential representing 1) of an electrical signal and the amplitude of another electrical signal are different from each other.

The first circuit 100 has first transistors, including a first-conduction-type transistor and a second-conduction-type transistor. A first first-conduction-type transistor 121 is formed in a second-conduction-type well 120 and has two first-conduction-type impurity regions 124 forming a source and a drain and a gate electrode 126. A first second-conduction-type transistor 141 is formed in a first-conduction-type well 140 and has two second-conduction-type impurity regions 144 forming a source and a drain and a gate electrode 146. Gate insulating films are respectively positioned below the gate electrodes 126 and 146. These two gate insulating films are substantially equal in thickness to each other.

A second-conduction-type impurity region 122 is formed in the well 120, while a first-conduction-type impurity region 142 is formed in the well 140. A piece of wiring through which a reference potential (ground potential) is applied to the first first-conduction-type transistor 121 is connected to the impurity region 122, while a piece of wiring through which a reference potential is applied to the first second-conduction-type transistor 141 is connected to the impurity region 142.

The second circuit 200 has second transistors, also including a first-conduction-type transistor and a second-conduction-type transistor. A second first-conduction-type transistor 221 is formed in a second-conduction-type well 220 and has two first-conduction-type impurity regions 224 forming a source and a drain and a gate electrode 226. A second second-conduction-type transistor 241 is formed in a first-conduction-type well 240 and has two second-conduction-type impurity regions 244 forming a source and a drain and a gate electrode 246. Gate insulating films are respectively positioned below the gate electrodes 226 and 246. In the example shown in the figure, these two gate insulating films are thicker than the gate insulating films of the first transistors provided in the first circuit. However, the gate insulating films of the first transistors and the second transistors may equal in thickness to each other.

A second-conduction-type impurity region 222 is formed in the well 220, while a first-conduction-type impurity region 242 is formed in the well 240. A piece of wiring through which a reference potential (ground potential) is applied to the second first-conduction-type transistor 221 is connected to the impurity region 222, while a piece of wiring through which a reference potential is applied to the second second-conduction-type transistor 241 is connected to the impurity region 242.

A method of manufacturing the semiconductor device according to the present embodiment will next be described. First, the first transistors are formed in a first region in the substrate 10 (a region where the first circuit 100 is formed as shown in FIG. 1), and the second transistors are formed in a second region in the substrate 10 (a region where the second circuit 200 is formed as shown in FIG. 1). Next, the multilayer wiring layer 400 is formed on the first transistor and the second transistor. When the multilayer wiring layer 400 is formed, the first inductor 310 and the second inductor 320 are formed above a third region in the substrate 10 (a region above which the signal transmitting device 300 is formed as shown in FIG. 1). In the example shown in FIG. 1, the second inductor 320 can be connected to the second circuit 200 via pads (not shown) formed in the uppermost wiring layer 442 and bonding wires (not shown). With respect to the arrangement shown in FIG. 1, "input electrical signals differ in potential from each other" means that the amplitude (the difference between a potential representing 0 and a potential representing 1) of an electrical signal and the amplitude of another electrical signal are different from each other.

The operation and advantages of the present embodiment will be described. When electrical energy or an electrical signal is transmitted through two inductors, the transmission efficiency is increased if the two inductors are brought closer to each other. In ordinary cases, therefore, the transmitting device is designed so that the two inductors are brought as close as possible to each other. In a case where the placement of the first inductor 310 and the second inductor 320 is designed on the basis of this design concept, the second inductor 320 is placed in the wiring layer next to and above the wiring layer in which the first inductor 310 is placed.

In contrast, in the present embodiment, the first inductor 310 is positioned in the nth wiring layer, while the second inductor 320 is placed in the mth wiring layer (m≧n+2). Also, no inductor is provided in any of the wiring layers positioned between the nth wiring layer and the mth wiring layer to be positioned above the first inductor 310. That is, the second inductor 320 is provided not in the wiring layer next to and above the wiring layer in which the first inductor 310 is formed but in the next wiring layer but one or more. Thus, the number of insulating films (insulating layers) positioned between the first inductor 310 and the second inductor 320 is increased relative to that in the case of the arrangement based on the above-described ordinary design concept, thereby increasing the insulation withstand voltage between the first inductor 310 and the second inductor 320. This effect is particularly high in a case where, as in the present embodiment, the first inductor 310 is positioned in the first wiring layer while the second inductor 320 is positioned in the uppermost wiring layer.

Also, the first inductor 310 and the second inductor 320 can be formed by only changing the wiring patterns in the wiring layers. Therefore, changes in the semiconductor device manufacturing facilities and processing conditions can be avoided and full use of the manufacturing conditions of the existing semiconductor device manufacturing facilities can be made.

Also, the first circuit 100, the second circuit 200 and the signal transmitting device 300 are formed on one substrate 10 in one process. As a result, the manufacturing cost of the semiconductor device is reduced and the semiconductor device is made small in size.

Figure 2:
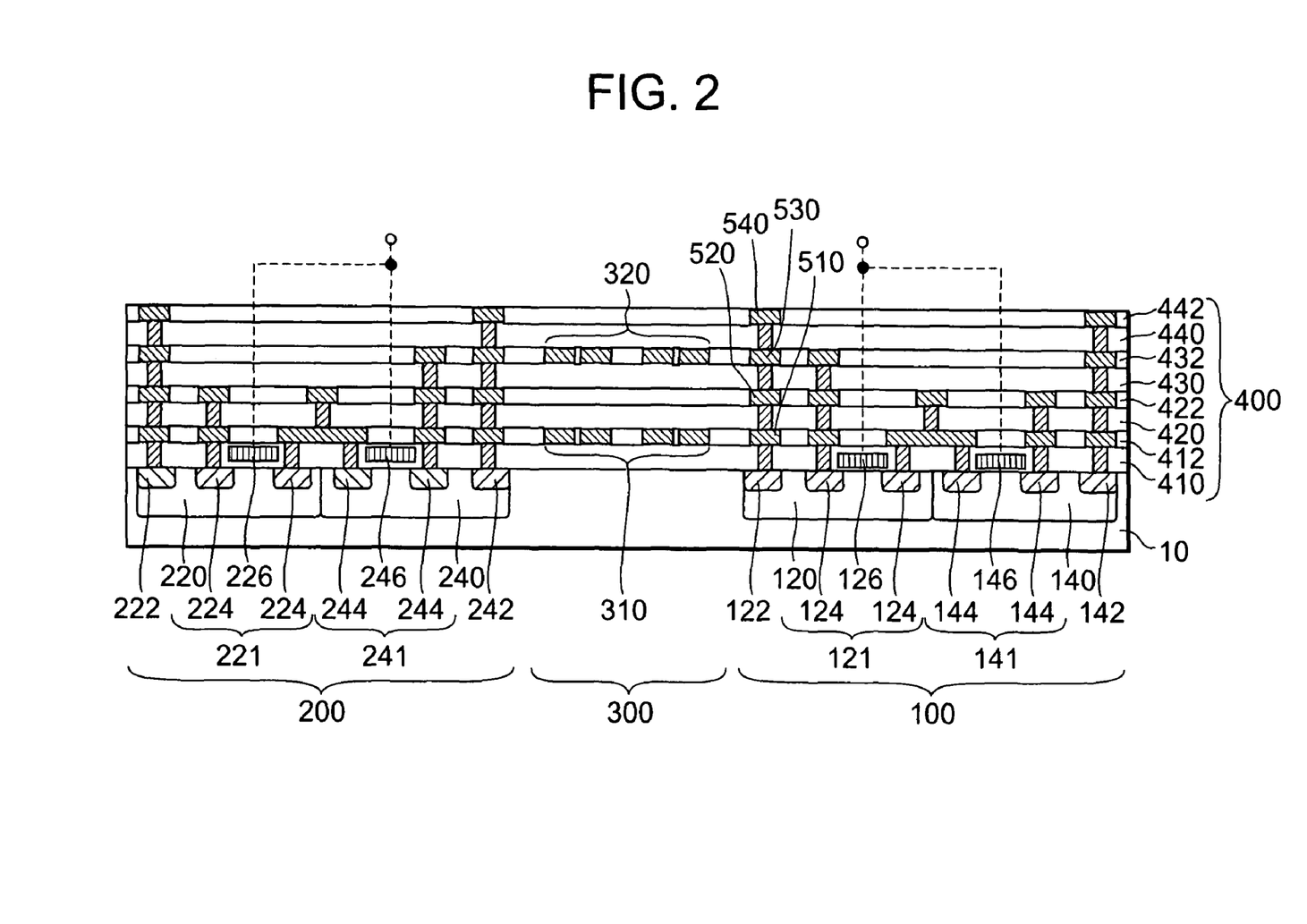
FIG. 2 is a sectional view of a semiconductor device according to a second embodiment of the present invention.

FIG. 2 is a sectional view of a semiconductor device according to the second embodiment. This semiconductor device is the same as the semiconductor device according to the first embodiment except that the second inductor 320 is positioned in the wiring layer 432 below the uppermost wiring layer 442. In the example shown in FIG. 2, the second inductor 320 can be connected to the second circuit 200 via pads (not shown) formed in the uppermost wiring layer 442 and bonding wires. With respect to the arrangement shown in FIG. 2 as well as with respect to the arrangement shown in FIG. 1, "input electrical signals differ in potential from each other" means that the amplitude (the difference between a potential representing 0 and a potential representing 1) of an electrical signal and the amplitude of another electrical signal are different from each other.

The same advantages as those of the first embodiment can also be obtained by the present embodiment. Also, since the first inductor 310 and the second inductor 320 are brought closer to each other, the signal transmission efficiency is improved and the power necessary for signal transmission in the signal transmitting device 300 is reduced.

Figure 3:
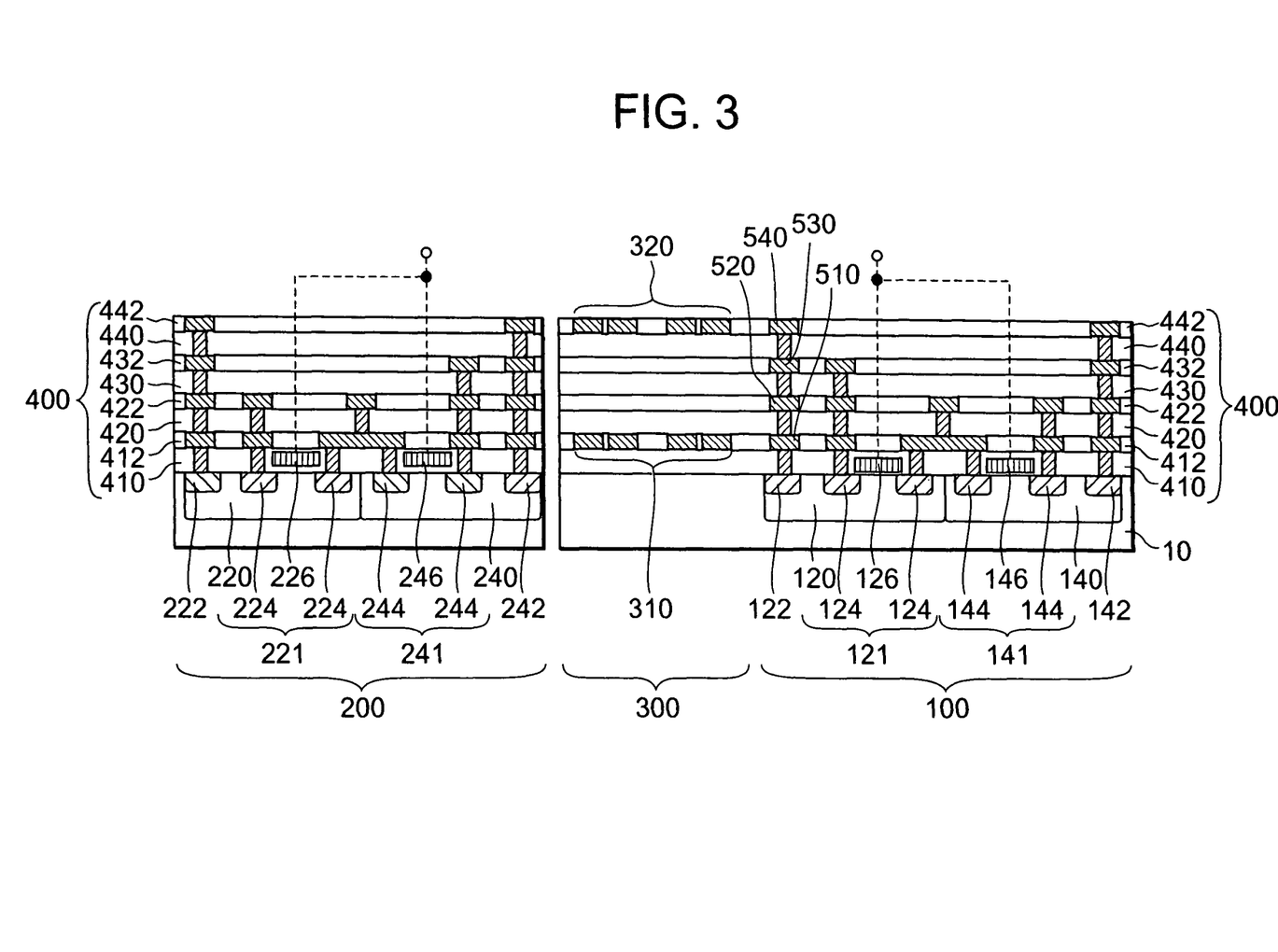
FIG. 3 is a sectional view of a semiconductor device according to a third embodiment of the present invention.

FIG. 3 is a sectional view of a semiconductor device according to the third embodiment. The construction of this semiconductor device is the same as that in the first embodiment except that the first circuit 100 and the signal transmitting device 300 are formed on the substrate 10 and the second circuit 200 is formed on a substrate 20. In the example shown in the figure, the first inductor 310 is connected to the first circuit 100 through the multilayer wiring layer 400 on the substrate 10, while the second inductor 320 is connected to the second circuit 200 via pads (not shown) formed in the uppermost wiring layer 442 on the substrate 20 and bonding wires (not shown). With respect to the arrangement shown in FIG. 3, "input electrical signals differ in potential from each other" means, for example, a case where the amplitude (the difference between a potential representing 0 and a potential representing 1) of an electrical signal and the amplitude of another electrical signal are different from each other, a case where reference potentials (potentials representing 0) of electrical signals are different from each other, and a combination of these cases.

Figure 4:
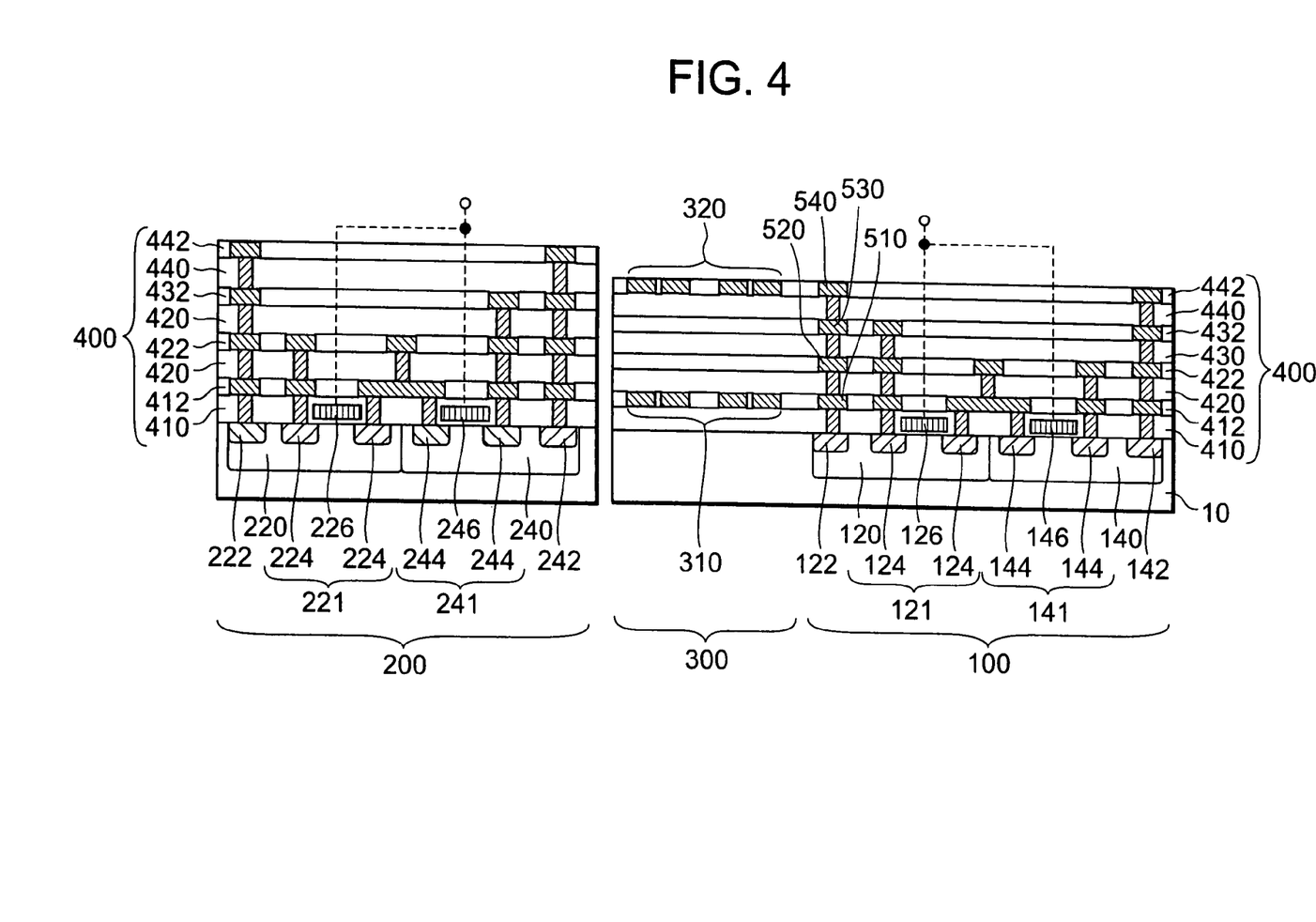
FIG. 4 is a sectional view showing a modified example of the third embodiment.

The number of wiring layers on the substrate 10 and the number of wiring layers on the substrate 20 are equal to each other in the example shown in the figure. However, these numbers may be different from each other. Also, while in the example shown in the figure the each layer and each wiring on the substrate 10 and the corresponding layer and wiring on the substrate 20 equal in thickness to each other, the layers and wirings on the substrates may differ in thickness from each other as in a modified example shown in FIG. 4. In the example shown in FIG. 4, the layers and wirings on the substrate 20 are thicker than those on the substrate 10. However, the layers and wirings on the substrate 10 may alternatively be thicker than those on the substrate 20.

The same advantages as those of the first embodiment can also be obtained by the present embodiment. Also, since the first circuit 100 and the second circuit 200 are respectively formed on different substrates 10 and 20, a short circuit between the reference potential of the first transistors of the first circuit 100 and the reference potential of the second transistors of the second circuit 200 can be prevented even if the reference potentials are largely different from each other (for example, the difference between the reference potentials is 100 V or higher). Also, since the first inductor 310 is connected not to the second circuit 200 but to the first circuit 100, the possibility of an increase in the potential difference between the first inductor 310 and the substrate 10 is low. Therefore, the occurrence of dielectric breakdown between the first inductor 310 and the substrate 10 can be reduced even though the first inductor 310 is placed in the lowermost wiring layer.

Also, the gate insulating films of the first transistors and the gate insulating films of the second transistors are made largely different from each other without using a complicated process.

Figure 5:
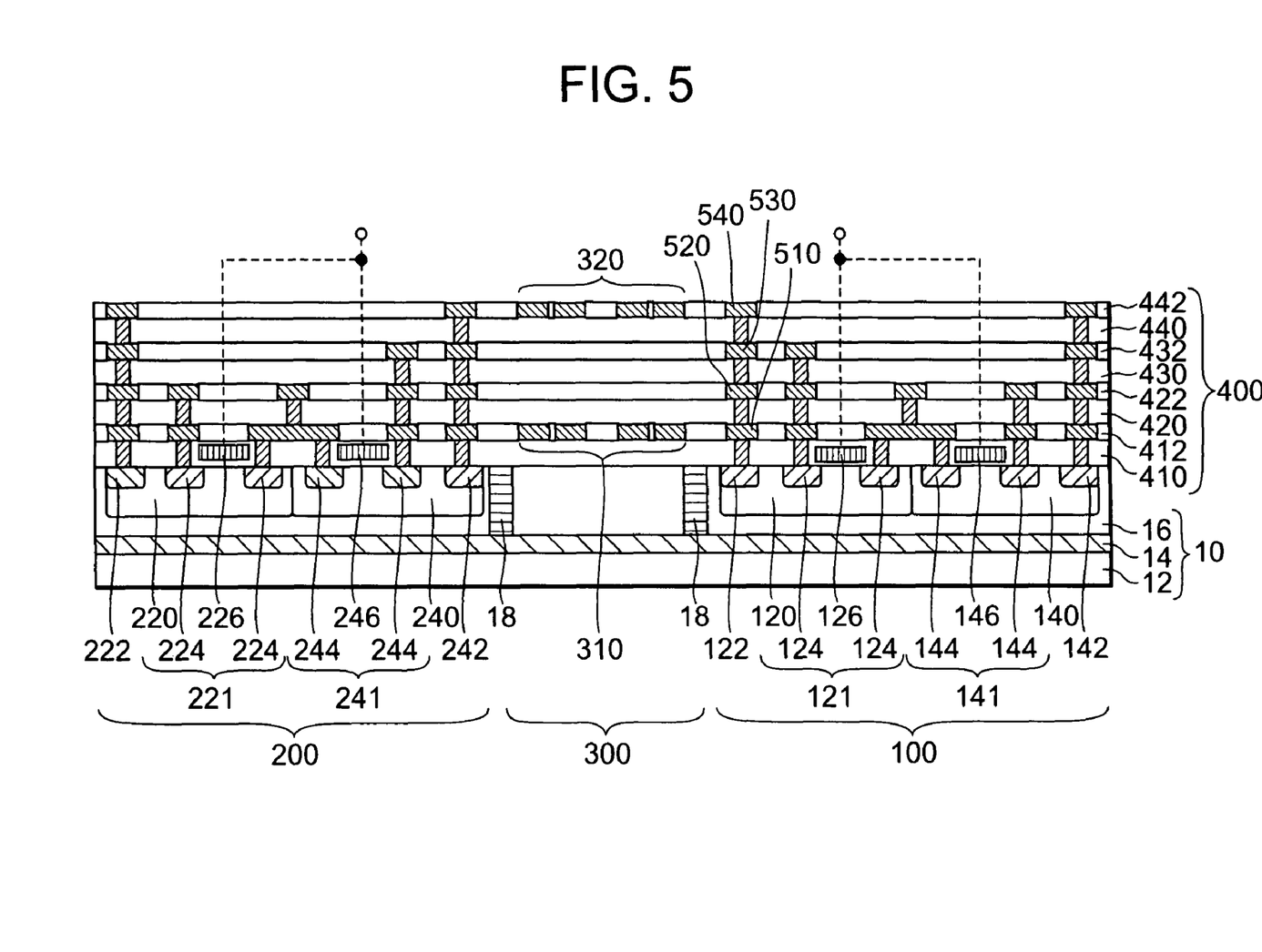
FIG. 5 is a sectional view of a semiconductor device according to a fourth embodiment of the present invention.

FIG. 5 is a sectional view of a semiconductor device according to the fourth embodiment. This semiconductor device is the same as the semiconductor device according to the first embodiment except that the substrate 10 is a silicon on insulator (SOI) substrate; embedded insulating layers 18 are formed in the substrate 10 between the first region in which the first circuit 100 is formed, the second region in which the second circuit 200 is formed and the third region above which signal transmitting device 300 is formed; and the first, second and third regions are insulated from each other by the embedded insulating layers 18.

The substrate 10 has a structure in which an insulating layer 14 and a silicon layer 16 are stacked in this order on a base substrate (e.g., a silicon substrate) 12. The first transistors of the first circuit 100 and the second transistors of the second circuit 200 are formed in the silicon layer 16. The embedded insulating layers 18 are embedded in the silicon layer 16, and bottom portions of the embedded insulating layers 18 are in contact with the insulating layer 14. In the example shown in FIG. 5, the second inductor 320 can be connected to the second circuit 200 via pads (not shown) formed in the uppermost wiring layer 442 and bonding wires (not shown). With respect to the arrangement shown in FIG. 5, "input electrical signals differ in potential from each other" means, for example, a case where the amplitude (the difference between a potential representing 0 and a potential representing 1) of an electrical signal and the amplitude of another electrical signal are different from each other, a case where reference potentials (potentials representing 0) of electrical signals are different from each other, and a combination of these cases.

The same advantages as those of the first embodiment can also be obtained by the present embodiment. Also, since the first region in which the first circuit 100 is formed and the second region in which the second circuit 200 is formed are insulated from each other in the substrate 10, the occurrence of a short circuit between the reference potential of the first transistors of the first circuit 100 and the reference potential of the second transistors of the second circuit 200 can be reduced even if the reference potentials are largely different from each other (for example, the difference between the reference potentials is 100 V or higher).

Figure 6:
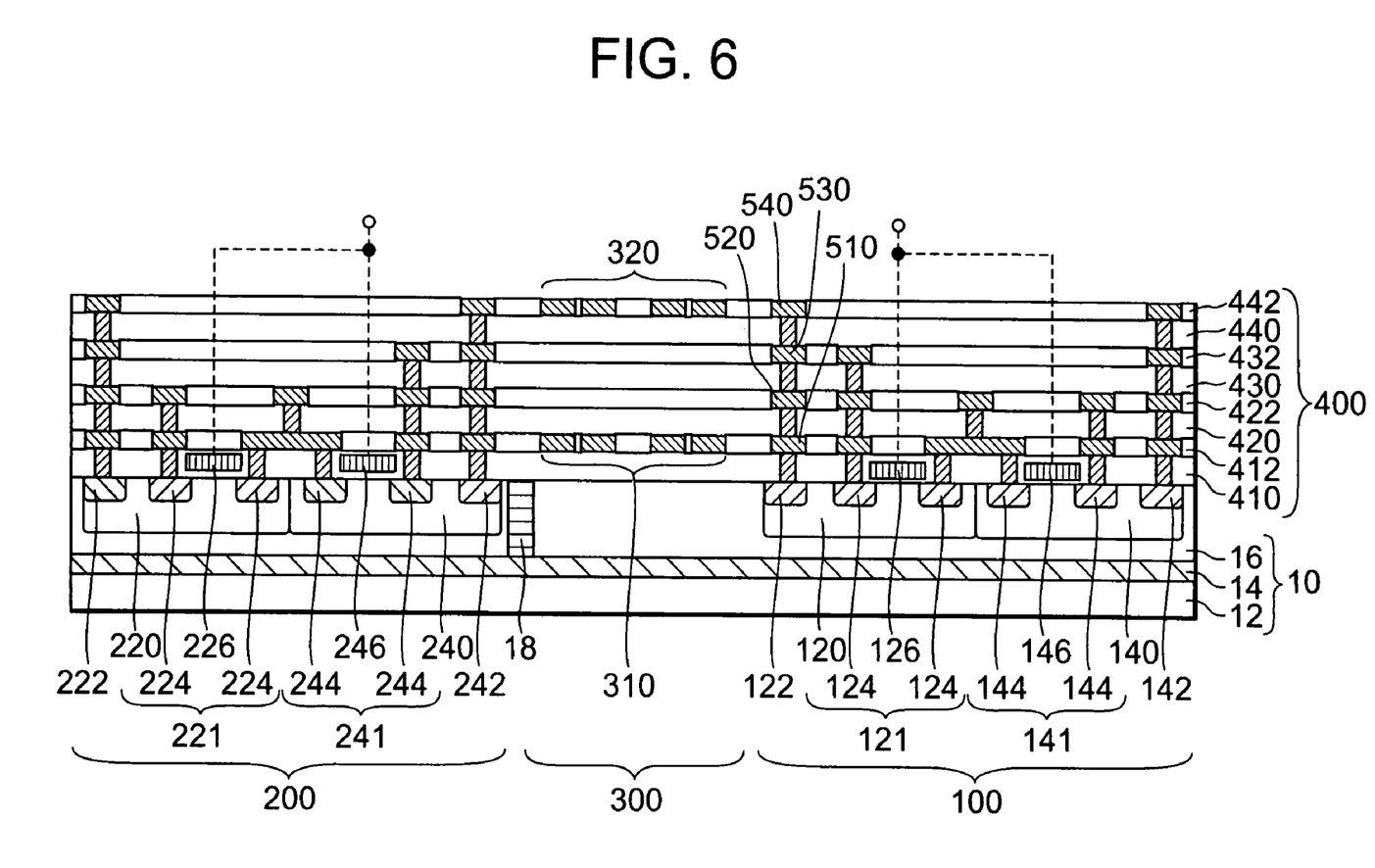
FIG. 6 is a sectional view of a semiconductor device according to a fifth embodiment of the present invention.

FIG. 6 is a sectional view of a semiconductor device according to the fifth embodiment. The construction of this semiconductor device is the same as that of the semiconductor device according to the fourth embodiment except that in the substrate 10 no embedded insulating layer 18 is provided between the first region in which the first circuit 100 is formed and the third region above which the signal transmitting device 300 is formed and the first region and the third region are electrically connected to each other. The first inductor 310 is connected to the first circuit 100. In the example shown in FIG. 6, the second inductor 320 can be connected to the second circuit 200 via pads (not shown) formed in the uppermost wiring layer 442 and bonding wires (not shown). With respect to the arrangement shown in FIG. 6, "input electrical signals differ in potential from each other" means, for example, a case where the amplitude (the difference between a potential representing 0 and a potential representing 1) of an electrical signal and the amplitude of another electrical signal are different from each other, a case where reference potentials (potentials representing 0) of electrical signals are different from each other, and a combination of these cases.

Also in the present embodiment, the first region and the third region are insulated from the second region in the substrate 10. Therefore the same advantages as those of the fourth embodiment can be obtained. While first region and the third region are electrically connected to each other, the possibility of an increase in potential difference between the first inductor 310 and the substrate 10 is low because the first inductor 310 is connected not to the second circuit 200 but to the first circuit 100. Consequently, the occurrence of dielectric breakdown between the first inductor 310 and the substrate 10 can be reduced even if the first inductor 310 is placed in the lowermost wiring layer 412.

Figure 7:
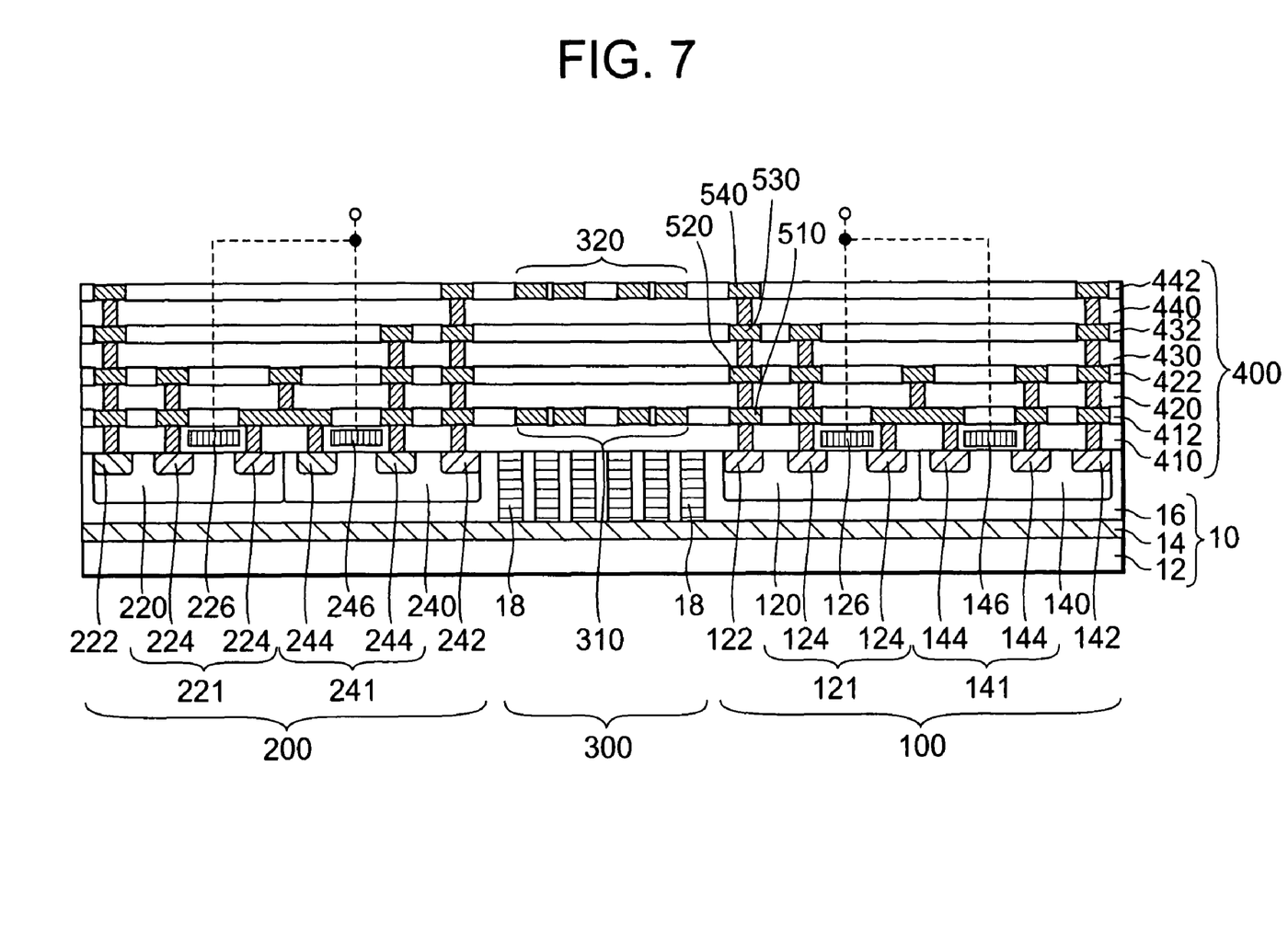
FIG. 7 is a sectional view of a semiconductor device according to a sixth embodiment of the present invention.

FIG. 7 is a sectional view of a semiconductor device according to the sixth embodiment. This semiconductor device is the same as the semiconductor device according to the fourth embodiment except that a plurality of embedded insulating layers 18 are provided in the substrate 10 below the first inductor 310 while being spaced apart from each other. In the example shown in FIG. 7, the second inductor 320 can be connected to the second circuit 200 via pads (not shown) formed in the uppermost wiring layer 442 and bonding wires (not shown). With respect to the arrangement shown in FIG. 7, "input electrical signals differ in potential from each other" means, for example, a case where the amplitude (the difference between a potential representing 0 and a potential representing 1) of an electrical signal and the amplitude of another electrical signal are different from each other, a case where reference potentials (potentials representing 0) of electrical signals are different from each other, and a combination of these cases.

The same advantages as those of the fourth embodiment can also be obtained by the present embodiment. Also, because a plurality of embedded insulating layers 18 are provided in the substrate 10 below the first inductor 310 while being spaced apart from each other, the occurrence of an eddy current in the substrate 10 due to a magnetic flux formed by the first inductor 310 and the second inductor 320 can be reduced to lower the Q-value of the signal transmitting device 300.

Figure 8:
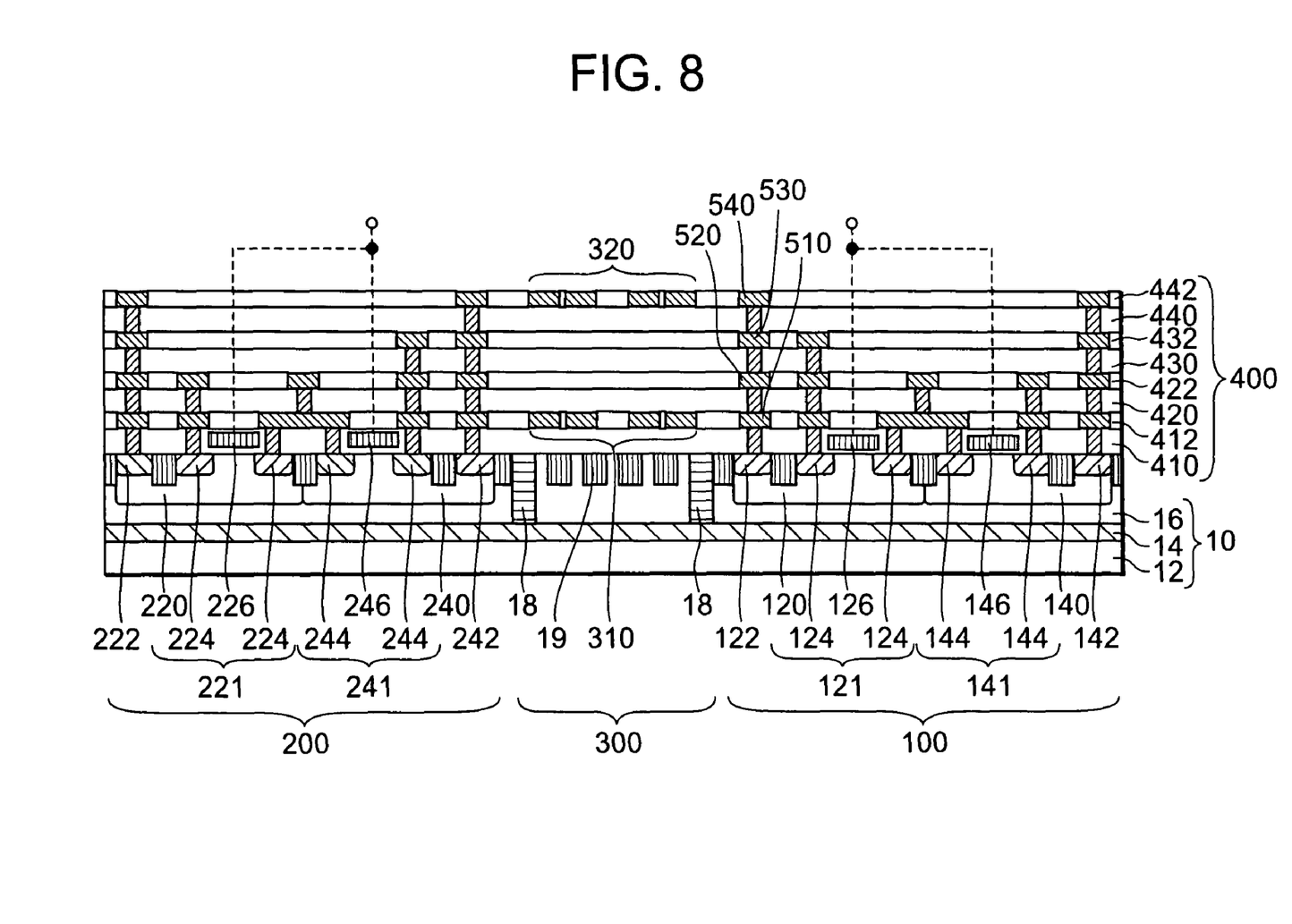
FIG. 8 is a sectional view of a semiconductor device according to a seventh embodiment of the present invention.

FIG. 8 is a sectional view of a semiconductor device according to the seventh embodiment. This semiconductor device is the same as the semiconductor device according to the sixth embodiment except that embedded insulating layers 19 separated from the insulating layer 14 are used in place of the embedded insulating layers 18 in contact with the insulating layer 14. The embedded insulating layers 19 are of a shallow trench isolation (STI) structure and can be formed by the same process as that for forming device separating films for the first transistors of the first circuit 100 and the second transistors of the second circuit 200. In the example shown in FIG. 8, the second inductor 320 can be connected to the second circuit 200 via pads (not shown) formed in the uppermost wiring layer 442 and bonding wires (not shown). With respect to the arrangement shown in FIG. 8, "input electrical signals differ in potential from each other" means, for example, a case where the amplitude (the difference between a potential representing 0 and a potential representing 1) of an electrical signal and the amplitude of another electrical signal are different from each other, a case where reference potentials (potentials representing 0) of electrical signals are different from each other, and a combination of these cases.

The same advantages as those of the sixth embodiment can also be obtained by the present embodiment. The same advantages can also be obtained by using an oxide film obtained by local oxidation of silicon (LOCOS) in place of the embedded insulating layer 19.

Figure 9:
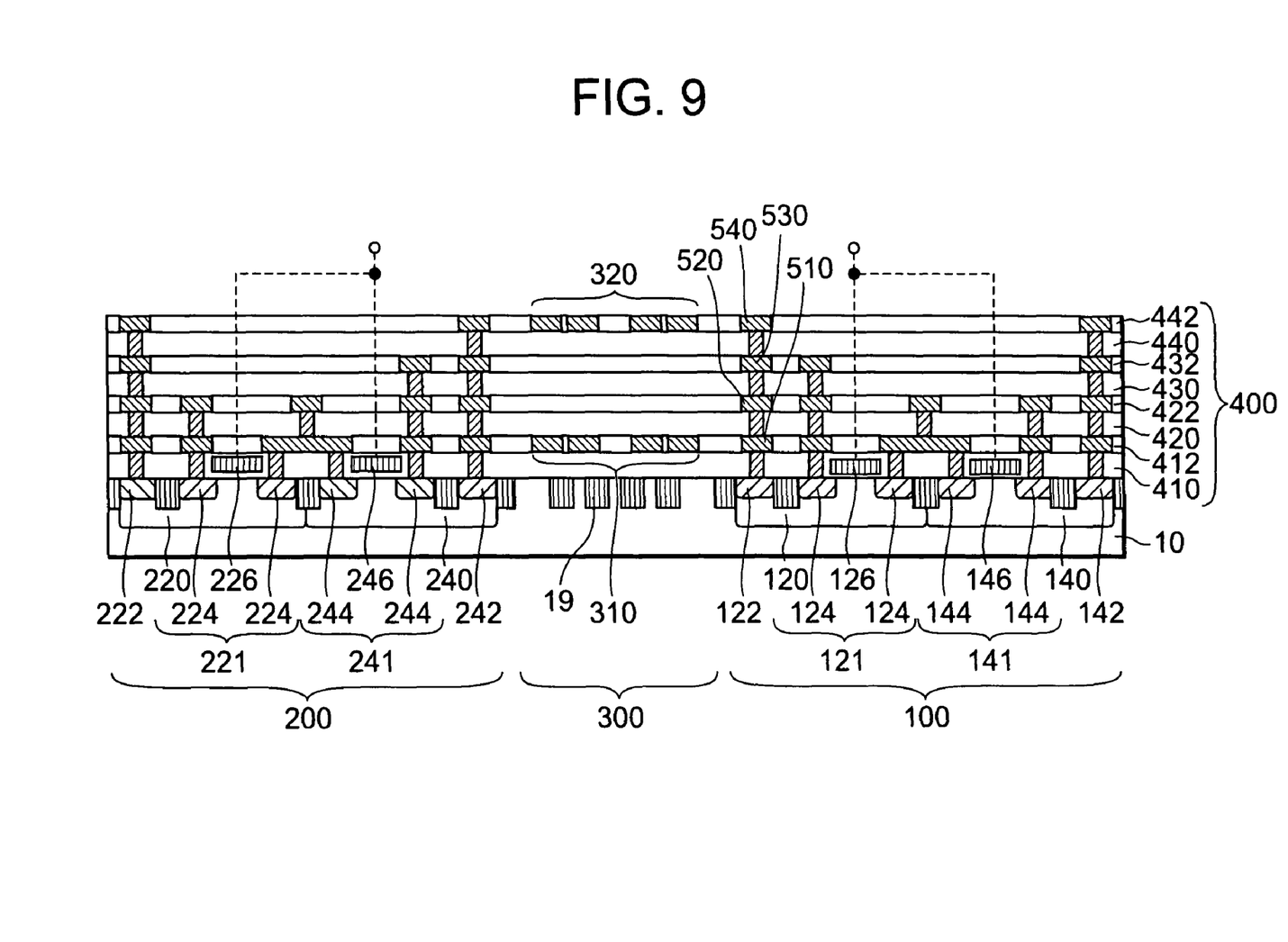
FIG. 9 is a sectional view of a semiconductor device according to an eighth embodiment of the present invention.

FIG. 9 is a sectional view of a semiconductor device according to the eighth embodiment. The construction of this semiconductor device is the same as that of the semiconductor device according to the first embodiment except that the embedded insulating layers 19 shown in the seventh embodiment are formed in the substrate 10 below the first inductor 310. In the example shown in FIG. 9, the second inductor 320 can be connected to the second circuit 200 via pads (not shown) formed in the uppermost wiring layer 442 and bonding wires (not shown). With respect to the arrangement shown in FIG. 9, "input electrical signals differ in potential from each other" means that the amplitude (the difference between a potential representing 0 and a potential representing 1) of an electrical signal and the amplitude of another electrical signal are different from each other.

The same advantages as those of the first embodiment can also be obtained by the present embodiment. Also, the occurrence of an eddy current in the substrate 10 can be reduced to lower the Q-value of the signal transmitting device 300. The same advantages can also be obtained by using LOCOS oxide film in place of the embedded insulating layer 19.

While the embodiments of the present invention have been described with reference to the drawings, the described embodiments are only an illustration of the present embodiment and various arrangements other than those described above can also be adopted.

What is claimed is:
1. A semiconductor device comprising:
a substrate;

a multilayer wiring layer formed on said substrate and having an insulating layer and a wiring layer alternately stacked in this order t or more times (t≧3) in this order;

a first inductor provided in the nth wiring layer in said multilayer wiring layer; and a second inductor provided in the mth wiring layer in said multilayer wiring layer (t≧m≧n+2) and positioned above said first inductor, wherein no inductor is provided in any of the wiring layers positioned between the nth wiring layer and the mth wiring layer to be positioned above the first inductor.

2. The semiconductor device according to claim 1, further comprising a first circuit connected to one of said first inductor and said second inductor.

3. The semiconductor device according to claim 2, wherein said first circuit is connected to said first inductor.

4. The semiconductor device according to claim 2, further comprising a second circuit connected to the other of said first inductor and said second inductor, a voltage different from a voltage input to said first circuit being input to said second circuit.

5. The semiconductor device according to claim 4, wherein said substrate is a SOI (silicon on insulator) substrate;

said first circuit has a first transistor formed in a first region of said substrate;

said second circuit has a second transistor formed in a second region of said substrate; and a semiconductor layer of said SOI substrate has an embedded insulating layer which insulates said first region and said second region from each other.

6. The semiconductor device according to claim 5, wherein said first transistor and said second transistor have reference potentials different from each other.

7. The semiconductor device according to claim 5, wherein said first inductor and said second inductor are formed above a third region between said first region and said second region in said SOI substrate;

said first inductor is connected to said first circuit; and said embedded insulating layer insulates the second region from said first region and said third region.

8. The semiconductor device according to claim 1, wherein said nth wiring layer is the lowermost layer in said wiring layer and the mth wiring layer is the uppermost layer in said wiring layer.

* * * * *